United States Patent [19]

Yoshida et al.

[11] Patent Number: 5,202,218
[45] Date of Patent: Apr. 13, 1993

[54] SCANNING EXPOSING TYPE LITHOGRAPHIC PRINTING PLATE WITH 1.5 WT. % OF WATER OR LESS

[75] Inventors: Akio Yoshida; Keisuke Iguchi; Hiroyuki Ishikura; Hiroshi Nishinoiri, all of Nagaokakyo, Japan

[73] Assignee: Mitsubishi Paper Mills Limited, Tokyo, Japan

[21] Appl. No.: 671,439

[22] Filed: Mar. 19, 1991

[30] Foreign Application Priority Data

Mar. 23, 1990 [JP] Japan .................. 2-074241
Apr. 3, 1990 [JP] Japan .................. 2-088673

[51] Int. Cl.⁵ .............. G03C 5/54; G03F 7/06
[52] U.S. Cl. .................. 430/204; 430/227; 430/229; 430/230; 430/231; 430/232; 430/249; 430/642; 430/935; 430/939
[58] Field of Search ............. 430/204, 227, 229, 230, 430/231, 232, 349, 642, 935, 939, 246

[56] References Cited

U.S. PATENT DOCUMENTS

| | | | |
|---|---|---|---|
| 2,095,850 | 10/1937 | Brooker . | |
| 2,095,854 | 10/1937 | Brooker . | |
| 2,588,811 | 3/1952 | Dippel et al. | 430/642 |
| 2,620,285 | 12/1952 | Rose | 430/935 |
| 2,912,343 | 11/1959 | Collins et al. . | |
| 2,955,939 | 10/1960 | Brooker et al. . | |
| 3,469,987 | 9/1969 | Owens et al. . | |
| 3,482,978 | 12/1969 | Fumia et al. . | |
| 3,482,981 | 12/1969 | Lare . | |
| 3,552,974 | 1/1971 | Jeffreys . | |
| 3,573,921 | 4/1971 | Jenkins et al. . | |
| 3,582,344 | 6/1971 | Heseltine et al. . | |
| 3,585,195 | 6/1971 | Heseltine et al. . | |
| 3,623,881 | 11/1971 | Fumia et al. . | |
| 3,721,539 | 3/1973 | Hansford | 65/19 |
| 4,501,811 | 2/1985 | Saikawa et al. . | |
| 4,916,043 | 4/1990 | Nagumo et al. | 430/349 |
| 5,102,770 | 4/1992 | Baba et al. | 430/230 |
| 5,108,872 | 4/1992 | Inoue et al. | 430/204 |

FOREIGN PATENT DOCUMENTS

| | | |
|---|---|---|
| 3425915 | 1/1985 | Fed. Rep. of Germany . |
| 47-26201 | 10/1972 | Japan . |
| 48-29723 | 9/1973 | Japan . |
| 48-30562 | 9/1973 | Japan . |
| 49-17725 | 5/1974 | Japan . |
| 53-21602 | 2/1978 | Japan . |
| 55-15011 | 4/1980 | Japan . |
| 55-39818 | 10/1980 | Japan . |
| 56-9750 | 1/1981 | Japan . |
| 1000115 | 8/1965 | United Kingdom . |
| 1012476 | 12/1965 | United Kingdom . |
| 1017273 | 1/1966 | United Kingdom . |
| 1042477 | 9/1966 | United Kingdom . |

OTHER PUBLICATIONS

Saikawa, Lithographic Printing Plate-Abstract JP-59,71055, Apr. 1984.
Saikawa, Lithographic Printing Plate for Laser Light--Abstract JP 59-71056, Apr. 1984.
Shiba, Photosensitive Lithographic Plate-Abstract JP 60-61752, Apr. 1985.
Kaneda, Lithographic Printing Plate, Abstract JP-60-75838, Apr. 1985.
Kaneda, Plate Making Method, Abstract JP-60-100148, Jun. 1985.
Tanaka, Silver Halide Photographic Sensitive Material, Abstract JP-61-114235, May 1986.
Nishinoiri, Preparation of Lithographic Plate, Abstract-JP-63-47756, Feb. 1988.
Baba, Silver Halide Photographic Emulsion, Abstract-JP-62-62353, Mar. 1987.
Baba, Silver Halide Photographic Emulsion, Abstract-JP-62-62354, Mar. 1987.

Primary Examiner—Richard L. Schilling
Attorney, Agent, or Firm—Cushman, Darby & Cushman

[57] ABSTRACT

The present invention provides a lithographic printing plate material for silver complex diffusion transfer process by scanning type exposure which comprises a film support and, provided thereon, at least a silver halide emulsion layer and a surface physical development nuclei layer, wherein water content in the whole lithographic printing plate material including the support is 1.5% or less. Preferably, the silver halide emulsion comprises about 95 mol % or more of silver chloride, 90% by weight or more of the silver halide grains have a size within ±40% of average grain size, the silver halide grains have an average grain size of about $0.3\mu$–about $1.0\mu$, and the surface of the grains is replaced with about 0.1 mol %–about 3.0 mol % of an iodide per 1 mol of the silver halide.

3 Claims, No Drawings

SCANNING EXPOSING TYPE LITHOGRAPHIC PRINTING PLATE WITH 1.5 WT. % OF WATER OR LESS

BACKGROUND OF THE INVENTION

The present invention relates to a lithographic printing plate material from which a lithographic printing plate is made utilizing the silver complex diffusion transfer process and which is suitable for exposing to scanning type exposure light sources such as laser beam, especially red or infrared laser beam and red light emitting diode.

Lithographic printing plates which have transfer silver images which are obtained by the silver complex diffusion transfer process and which are utilized immediately as ink-receptive areas are disclosed in Japanese Patent Kokoku No. 48-30562 and Japanese Patent Kokai Nos. 53-21602, 54-10310, and 56-9750 and are well known.

A typical silver complex diffusion transfer process suitable for making such lithographic printing plates is carried out in the following manner. A photosensitive material which comprises a support and, provided thereon, an antihalation layer, a silver halide emulsion layer, and physical development nuclei layer is subjected to imagewise exposure and then to development treatment, whereby the silver halide of the latent image area formed by the imagewise exposure is converted to blackened silver in the emulsion layer and simultaneously, the silver halide other than the latent image area is dissolved by the action of silver halide complexing agent contained in the development processing solution and diffuses to the surface of the photosensitive material. The dissolved and diffused silver complex is precipitated as a silver image on the physical development nuclei of the surface layer by the reducing action of developing agent. If necessary, the silver image is subjected to lipophilization treatment after the development in order to enhance ink-receptivity of the resulting silver image. Thereafter, the resulting lithographic printing plate is mounted on an offset printing machine and inked image is transferred to a material on which the image is to be printed.

According to the above conventional method, the silver halide emulsion layer is spectrally sensitized with merocyanine dye, cyanine dye or the like so as to have a sensitive maximum in green region of around 550 nm and is subjected to an exposure for several seconds —several ten seconds by a process camera having a usual light source such as tungsten light source. However, the above conventional method has limit even though the above lithographic printing plate material is inherently excellent in sharpness and resolution. In addition, when a color print is to be obtained from a color original, not only the resolution is insufficient, but also production of the printing plate material and plate making operation are complicated.

For solving the above problems, there have been proposed methods of direct plate making using laser beam For example, lithographic printing plate materials applied to exposure to helium/neon laser, argon ion laser, semiconductor laser, light emitting diode and the like are disclosed in U.S. Pat. No. 4,501,811 and Japanese Patent Kokai Nos. 59-71055, 59-71056, 60-61752, 60-75838, 60-100148, 61-114235 and 63 47756.

However, as also mentioned in the above cited patent publications, in the case of lithographic printing plate materials which utilize silver complex diffusion transfer process, the surface physical development nuclei layer greatly affects the spectral sensitizability and as a result, sensitivity to the desired laser beam decreases or storage stability is deteriorated. Moreover, as a result of formation of soft transfer precipitated silver image by silver complex diffusion transfer processing, sharpness and resolution deteriorate and further stain in background occurs or the silver image is torn off during printing and so, a sufficient printing endurance cannot be obtained Thus, lithographic printing plate of high quality cannot be made. Therefore, not only the sensitizing dyes which can solve the above problems must have a sufficiently high sensitivity to the wavelength of laser beams, but also it is required that they are superior in storage stability, can form a hard transfer precipitated silver image, do not have bad effects such as stain of background and can form strong transfer precipitated silver image which is not torn off during printing even if it is silver of fine crystal.

On the other hand, as light sources for scanning plate making, there are used helium.cadmium laser, argon laser, helium.neon laser, semiconductor laser, light emitting diode, etc. Among them, red scanning exposure light sources of 600-700 nm such as helium.neon laser and red light emitting diode are generally often used in this field. Furthermore, high performance semiconductor lasers based on the recent progress of semiconductor technique has come to be used. The wavelength of semiconductor laser beam used as scanning exposure light sources is mainly 780 nm which is in near infrared region. In the case of helium.neon laser, oscillated wavelength is 632.8 nm and hence, in order to make the above-mentioned lithographic printing plate using helium.neon laser beam as a light source, the silver halide emulsion layer used in lithographic printing plate materials must satisfy the above various characteristics in addition to high sensitivity to 632.8 nm which is wavelength of helium.neon laser beam.

Such characteristics are also influenced by factors such as halogen composition of silver halide emulsion, size of silver halide grains and kind and degree of chemical sensitization. Emulsions mainly composed of silver chloride as a silver halide have the advantage that diffusion transfer development rapidly proceeds and transfer precipitated silver which is utilized as ink-receptive area can be readily produced. However, they are generally low in sensitivity and if they are sufficiently chemically sensitized for further enhancing sensitivity, the sensitivity to laser beam further decreases. Moreover, if the diffusion transfer development is carried out at too high speed, printing strength of the transfer precipitated silver tends to decrease.

In the case of a lithographic printing plate material from which a lithographic printing plate is made utilizing silver complex diffusion transfer process and which is suitable for exposing to scanning exposure light sources such as laser beams, especially red or infrared laser beam and red light emitting diode, it is difficult to satisfy all of the above requirements such as high sensitivity, high resolution, high printing endurance, storage stability, etc.

Furthermore, properties required for scanning type lithographic printing plate materials include image reproducibility and exposure latitude. In order to improve the image reproducibility and the exposure latitude, there have been employed various methods such as providing a black antihalation layer and addition of an irradiation inhibiting dye to emulsion, but these methods are still not satisfactory.

SUMMARY OF THE INVENTION

The object of the present invention is to provide a lithographic printing plate material which is high in sensitivity, contrast and printing endurance and excellent in storage stability and from which a lithographic printing plate is made utilizing silver complex diffusion transfer process and employing scanning exposure light source such as laser beams, especially red or infrared laser beam and red light emitting diode as light sources.

The above object has been attained by a lithographic printing plate material which comprises a film support and, provided thereon, at least a silver halide emulsion layer and a surface physical development nuclei layer for silver complex diffusion transfer process utilizing a scanning exposure light source as a light source, characterized in that water content in the whole lithographic printing plate material including the support is 1.5% or less.

The water content of the whole lithographic printing plate material including the film support can be changed by changing drying conditions at the time of coating the layers constituting the lithographic printing plate material such as back coat layer, subbing layer, silver halide emulsion layer, physical development nuclei layer, etc. That is, the water content can be controlled by changing the degree of drying of the coats by adjusting the temperature, dew point and flow rate of air used for drying in various coating methods known in this technical field. Alternatively, the water content can also be controlled by placing the lithographic printing plate material under the conditions of temperature and humidity of specific ranges at one of various steps of production of the lithographic printing plate material. The present invention is not limited to the above-mentioned water content controlling methods and can employ all of possible water content controlling methods conducted through a series of steps of production of lithographic printing plate materials.

The lithographic printing plate material of low water content according to the present invention can be obtained under the condition of over drying as compared with the drying condition at coating which is conventionally employed in this technical field. That is, such over drying conditions as raising of temperature and lowering of dew point of drying air and increasing of air flow rate. Alternatively, the reduction of water content can also be attained by placing the lithographic printing plate material under the condition of low humidity at either one stage of various steps for production of lithographic printing plate materials.

Water content of the whole lithographic printing plate material including a film support can be measured by any generally known methods for measurement of water content. That is, there may be used infrared moisture meter, over drying method, dielectric constant method, Karl Fischer method, and the like. The water content here is defined by the ratio of total weight of water contained in the lithographic printing plate material including the support and the weight of the lithographic printing plate material including the support.

The red sensitizing dyes used in the present invention may be any dyes, for example, those which are known in Japanese Patent Kokoku Nos. 49-17725, 55-15011 and 55-39818 and Japanese Patent Kokai Nos. 59-71055 and 59-71056 and in addition, these may be combinations of dyes as disclosed in Japanese Patent Kokai Nos. 61-114235, 62-62353, 62-62354 and the like. Examples of the red sensitizing dyes used in the present invention are shown below. Of course, the present invention is never limited to only these red sensitizing dyes.

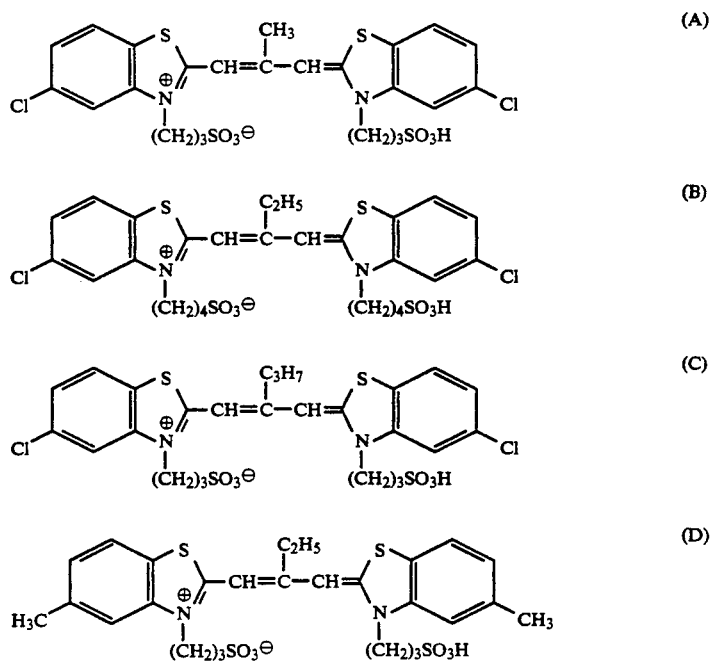

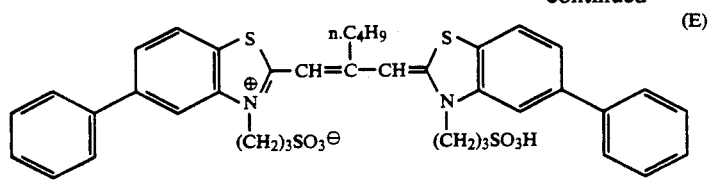
(E)
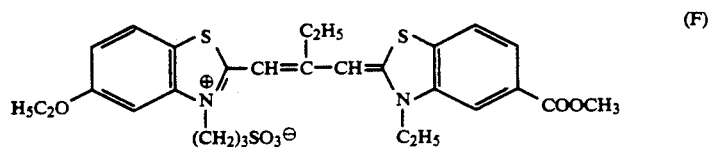
(F)
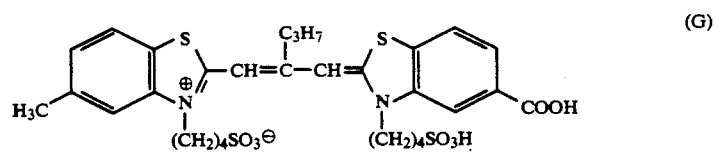
(G)
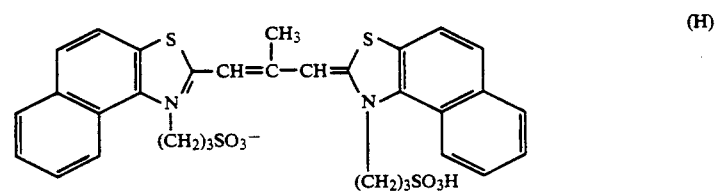
(H)
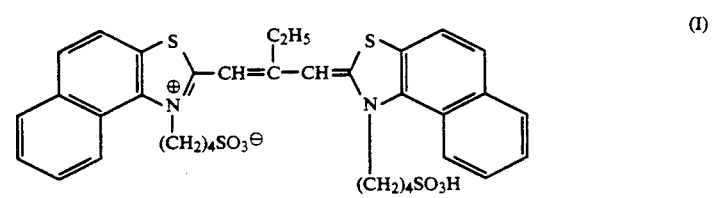
(I)
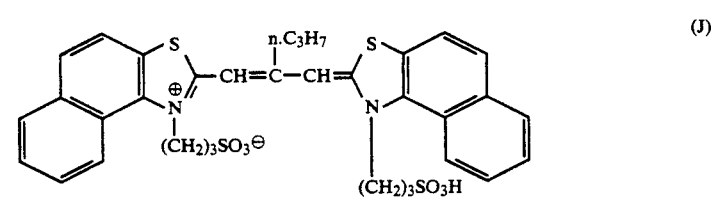
(J)
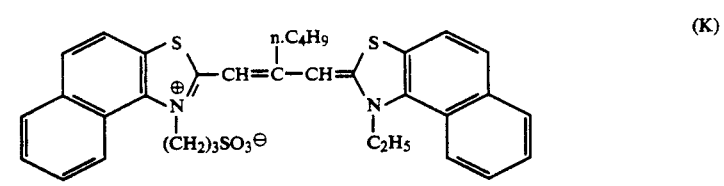
(K)
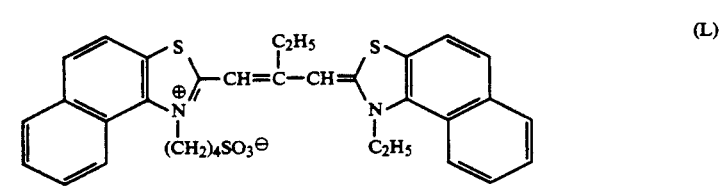
(L)
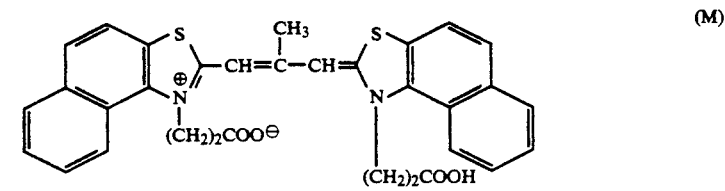
(M)

-continued
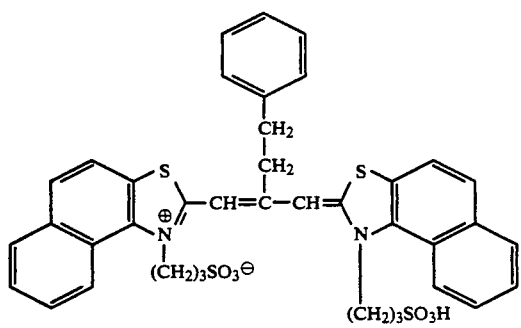
(N)
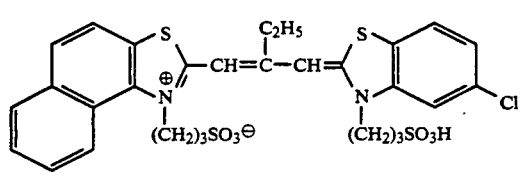
(O)
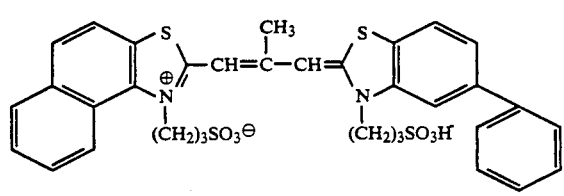
(P)
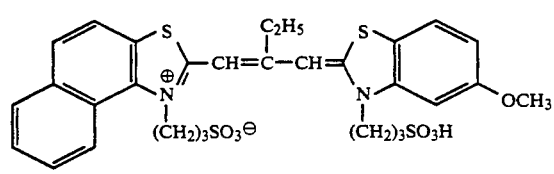
(Q)
Examples of combination of the dyes are shown below.
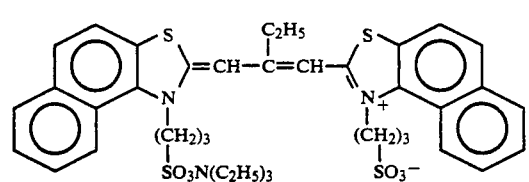
[I-A]
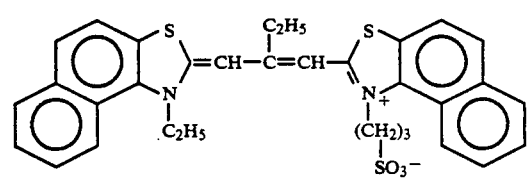
[I-B]
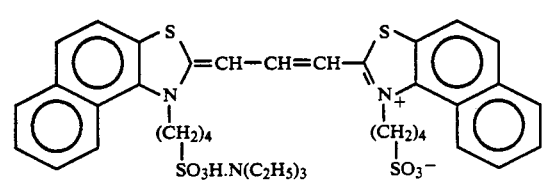
[I-C]

-continued
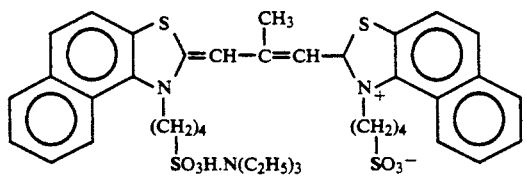 [I-D]
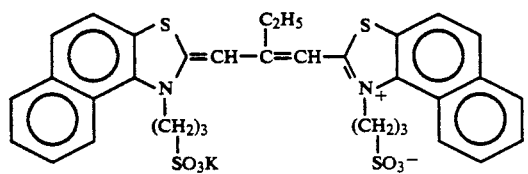 [I-E]
[I-F]
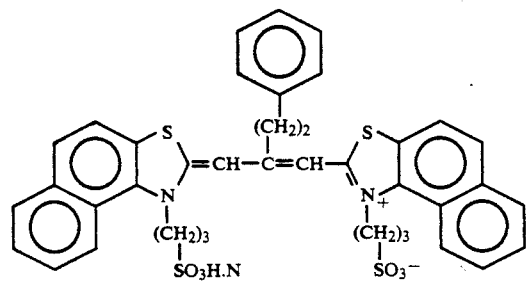
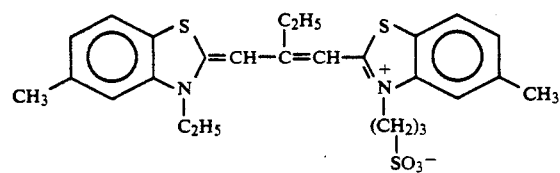 [I-G]
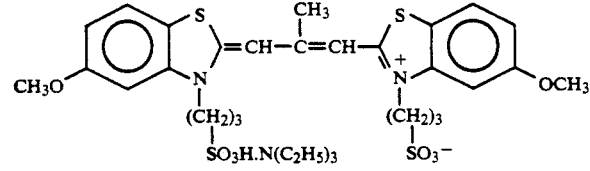 [I-H]
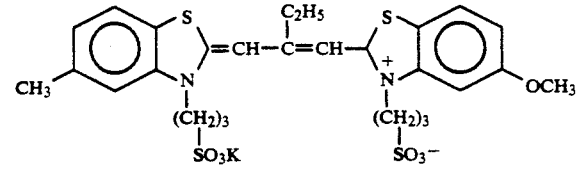 [I-I]
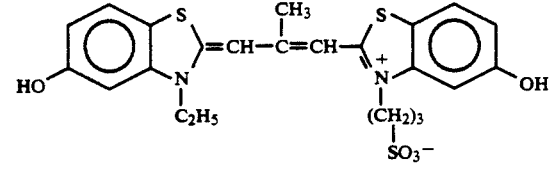 [I-J]
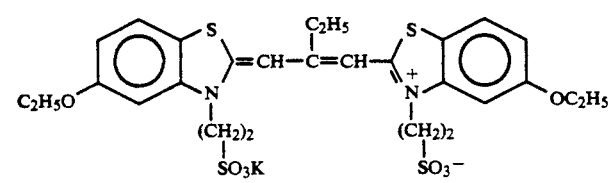 [I-K]

-continued
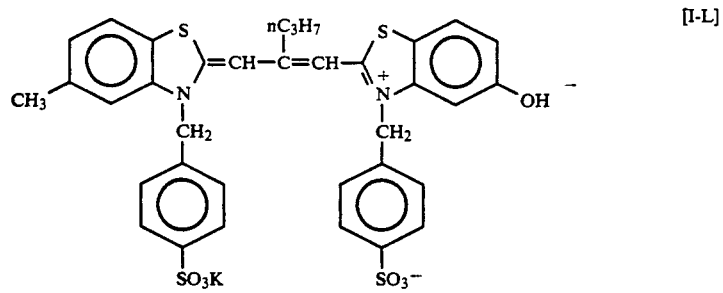 [I-L]
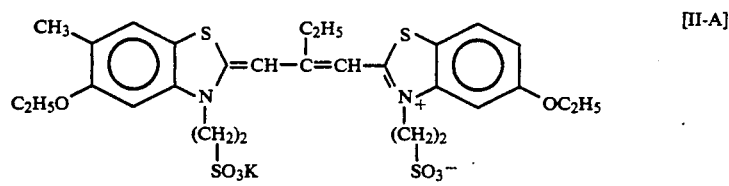 [II-A]
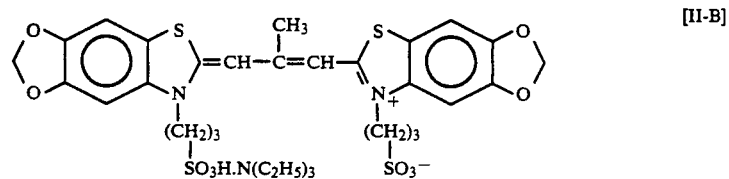 [II-B]
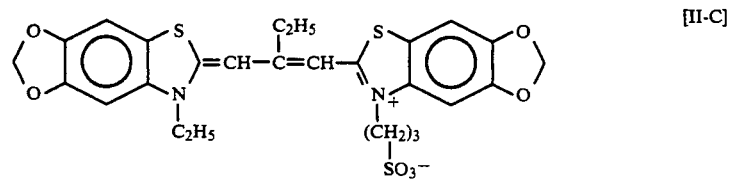 [II-C]
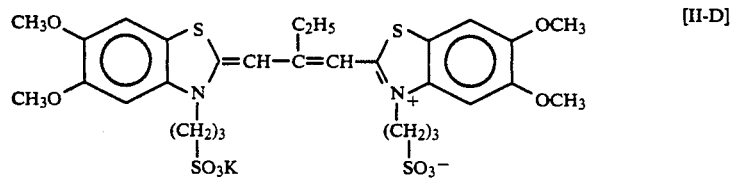 [II-D]
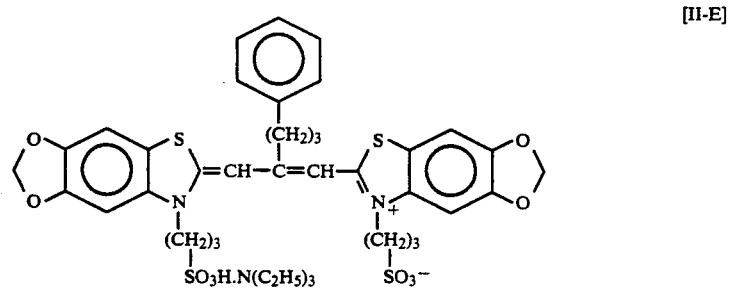 [II-E]
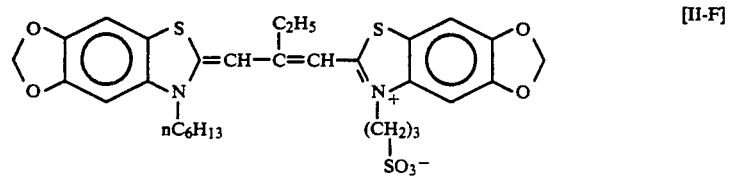 [II-F]

-continued

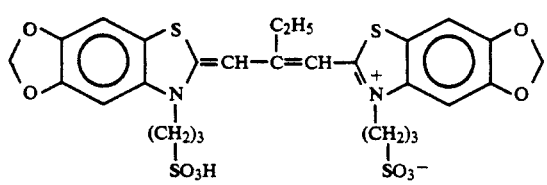 [II-G]

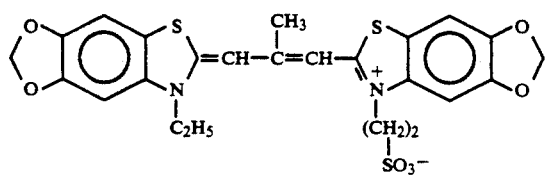 [II-H]

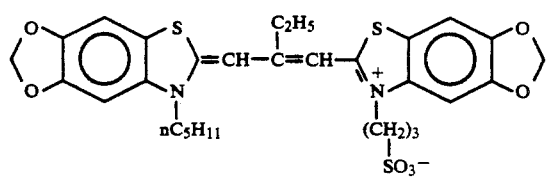 [II-I]

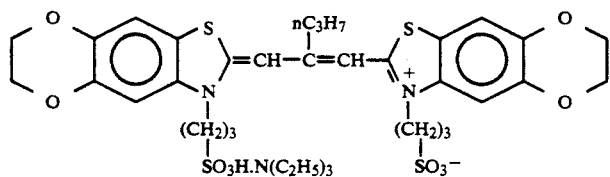 [II-J]

The above dyes I and II can be utilized in combination.

The infrared sensitizing dyes having their maximum spectral sensitivities in the region of longer than 700 nm which are used in the present invention can be those which are mentioned in U.S. Pat. Nos. 2,095,854, 2,095,856, 2,955,939, 3,482,978, 3,552,974, 3,573,921, 3,582,344, and 3,623,881.

Preferably, the dyes represented, for example, by the following formulas (I)–(IV) are used.

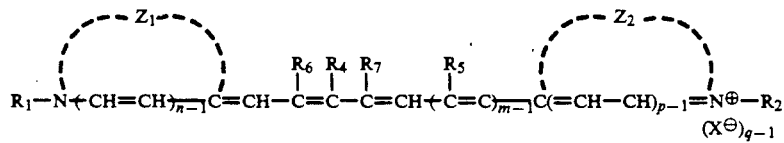 Formula (I)

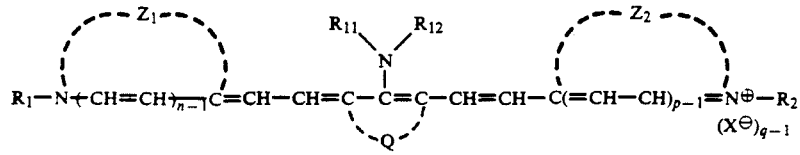 Formula (II)

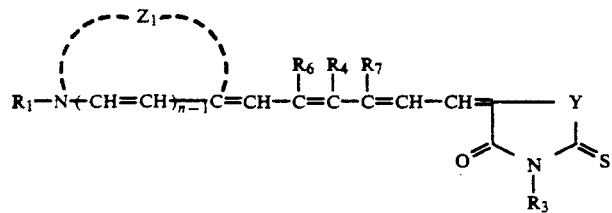 Formula (III)

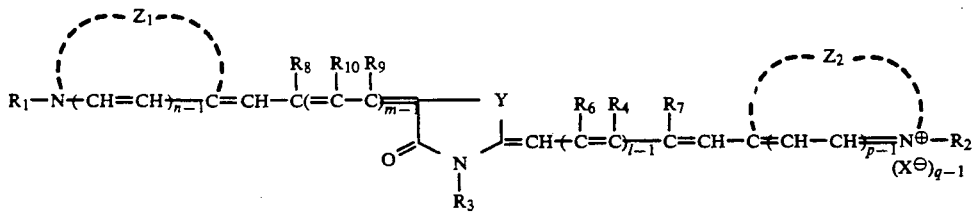

Formula (IV)

In the above formulas (I)-(IV), $Z_1$ and $Z_2$ which may be identical or different each represents a group of atoms necessary to form a 5- or 6-membered nitrogen containing heterocyclic ring; $R_1$ and $R_2$ which may be identical or different each represents an alkyl group or an alkenyl group; $R_3$ represents an alkyl group, an alkenyl group or an aryl group; $R_4$ -$R_{10}$ which may be identical or different each represents a hydrogen atom, a hologen atom, an alkyl group, an aryl group or an alkoxy group and $R_6$ and $R_7$ or $R_8$ and $R_9$ may link to each other to form a 5- or 6-membered ring; $R_{11}$ and $R_{12}$ which may be identical or different each represents an alkyl group or an aryl group and $R_{11}$ and $R_{12}$ may link to each other to form a 5- or 6-membered ring; Y represents a sulfur atom, an oxygen atom or $>N-R_{13}$ ($R_{13}$ is an alkyl group); Q represents a group Of atoms necessary to form a 5- or 6-membered ring; X represents an acid anion; and l, m, n and q each represents 1 or 2.

As examples of $Z_1$ and $Z_2$, mention may be made of nitrogen-containing heterocyclic rings such as thiazole, benzothiazole, naphtho[1,2-a]thiazole, naphtho[2,1-a]thiazole, naphtho[2,3-a]thiazole, selenazole, benzoselenazole, naphthol 2,1-a]selenzaole, naphto[1.2-a]selenazole, oxazole, benzoxazole, naphtho[1,2-a]oxazole, naphtho[2,1-a]oxazole, naphtho[2,3-a]oxazole, 2-quinoline, 4-quinoline, 3,3-dialkylindolenine, imidazole, benzimidazole, naphtho[1,2-a]imidazole, and pyridine. These heterocyclic rings may have one or more substituents such as alkyl groups (e.g., methyl, ethyl, butyl, and trifluoromethyl), aryl groups (e.g., phenyl and tolyl), hydroxyl group, alkoxy groups (e.g., methoxy, ethoxy and butoxy), carboxyl group, alkoxycarbonyl groups (e.g., methoxycarbonyl and ethoxycarbonyl), halogen atoms (e.g., fluorine, chlorine, bromine and iodine), aralkyl groups (e.g., benzyl and phenetyl), cyano group and alkenyl groups (e.g., allyl).

In $R_1$ and $R_2$, examples of the alkyl group are lower alkyl groups such as methyl, ethyl, propyl and butyl, hydroxyalkyl groups such as $\beta$-hydroxyethyl and $\gamma$-hydroxypropyl, alkoxyalkyl groups such as $\beta$-methoxyethyl and $\gamma$-methoxypropyl, acyloxyalkyl groups such as $\beta$-acetoxyethyl, $\gamma$-aceloxypropyl and $\beta$-benzoyloxyethyl, carboxyalkyl groups such as carboxymethyl and $\beta$-carboxyethyl, alkoxycarbonylalkyl groups such as methoxycarbonylmethyl, ethoxycarbonylmethyl and $\beta$-ethoxycarbonylethyl, sulfoalkyl groups such as $\beta$-sulfoethyl, $\gamma$-sulfopropyl and $\delta$-sulfobutyl, and aralkyl groups such as benzyl, phenetyl and sulfobenzyl, and examples of the alkenyl group are allyl, etc.

As examples of $R_3$, mention may be made of the alkyl and alkenyl groups as enumerated above for $R_1$ and $R_2$, and aryl groups such as phenyl, tolyl, methoxy-phenyl, chlorophenyl and naphtyl group.

Examples of $R_4$-$R_{10}$ are hydrogen atom, halogen atoms (such as chlorine, bromine, iodine and fluorine), the alkyl groups and aryl groups as enumerated above for $R_1$ and $R_2$ and alkoxy groups having the alkyl groups as enumerated above for $R_1$ and $R_2$ (namely, $OR_1$ groups), and the 5- or 6-membered ring formed by $R_6$ and $R_7$ or $R_8$ and $R_9$ may be substituted with a lower alkyl group or the like. $R_{11}$ and $R_{12}$ are the alkyl groups or the aryl groups as enumerated above for $R_1$ and $R_2$ and $R_{11}$ and $R_{12}$ may ling to each other to form a 5- or 6-membered ring. As $R_{13}$, mention may be made of the alkyl groups as enumerated above for $R_1$ and $R_2$.

Examples Of the acid anion X are alkylsulfate ions such as methylsulfate ion and ethylsulfate ion, thiocyanate ion, toluenesulfate ion, halogen ions such as chloride ion, bromide ion, and iodide ion, and perchlorate ion and X is not present when the dyes have betaine-analogous structure.

Examples of the sensitizing dyes used in the present invention shown below.

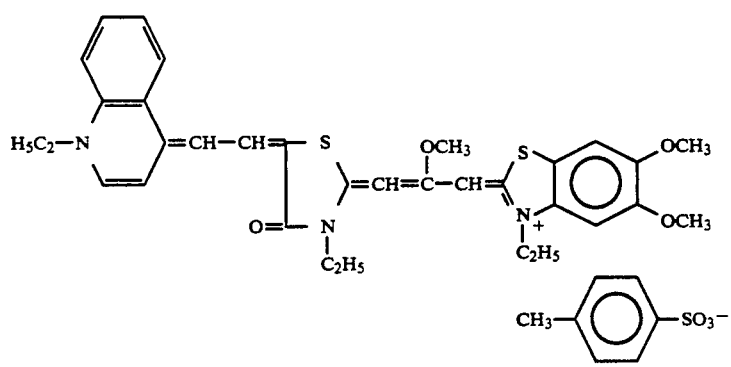

(1)

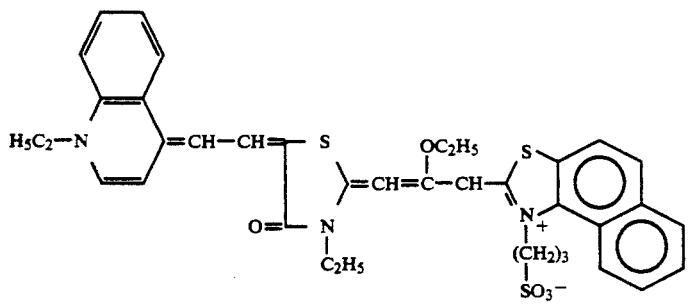
(2)
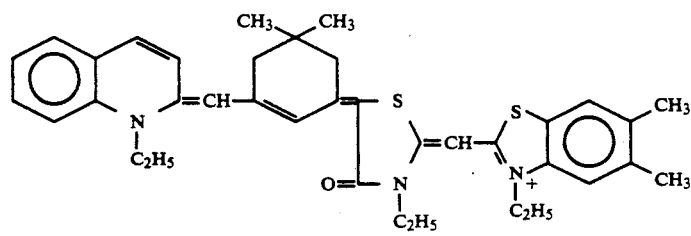
(3)
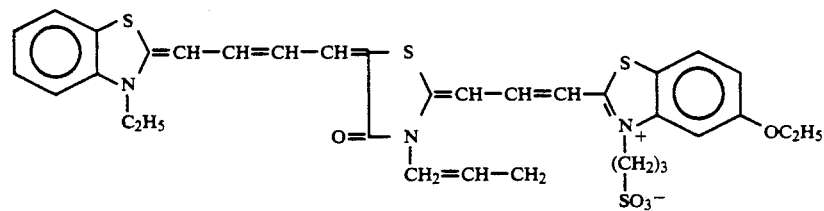
(4)
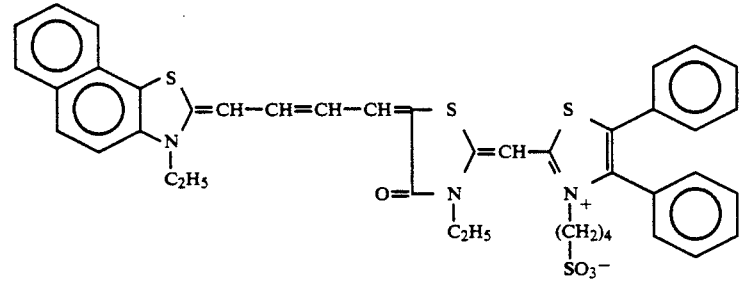
(5)
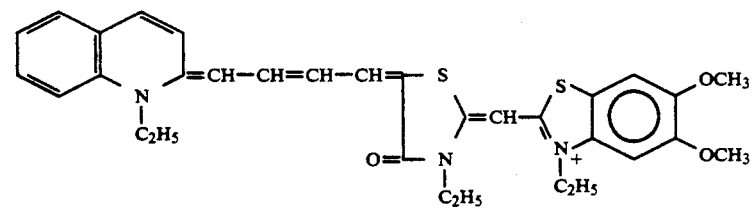
(6)
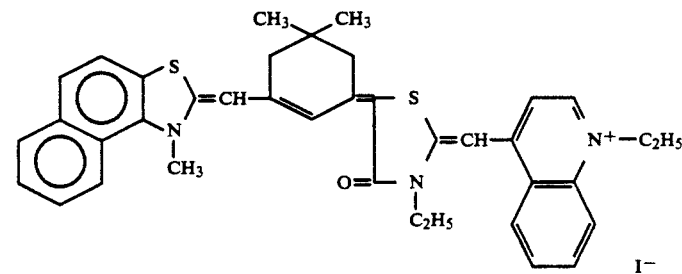
(7)

-continued
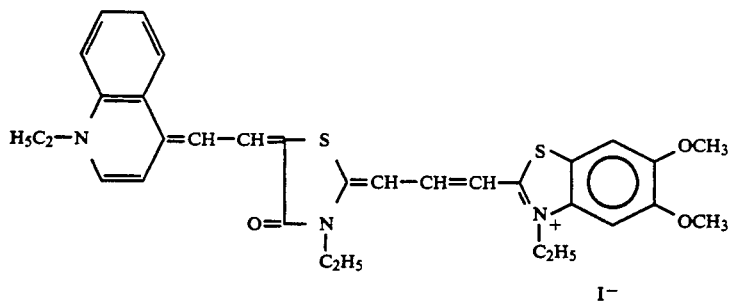
(8)
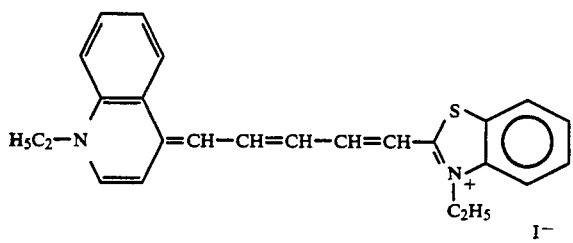
(9)
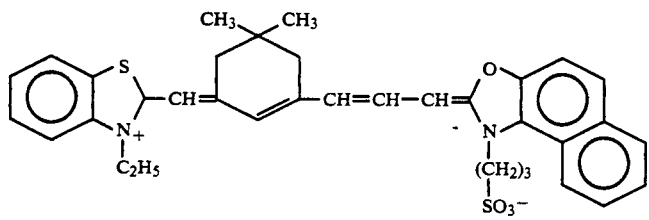
(10)
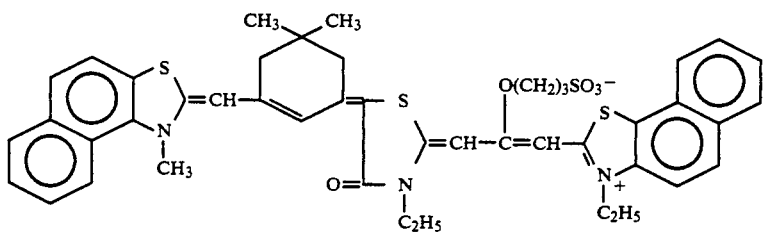
(11)
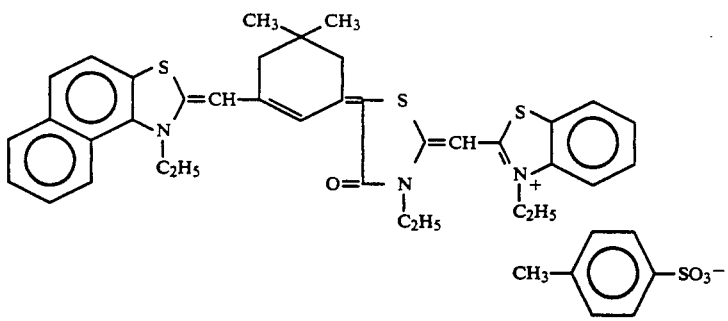
(12)
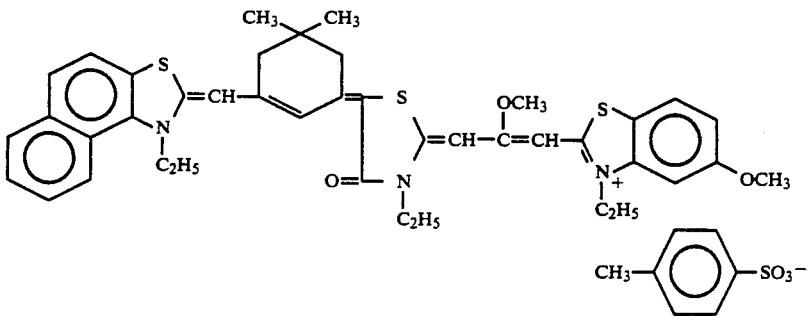
(13)

-continued
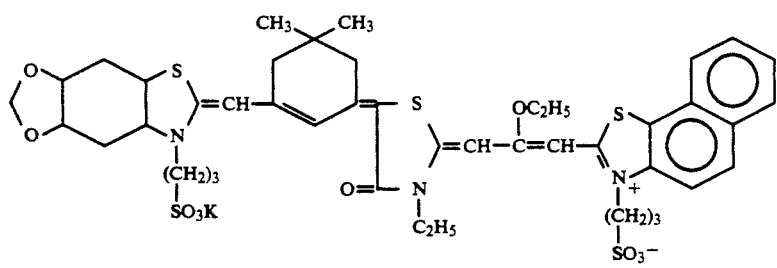 (14)
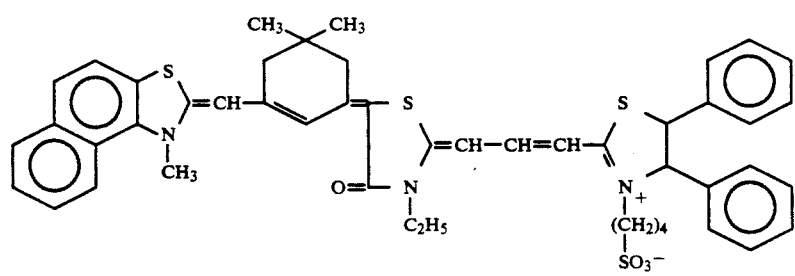 (15)
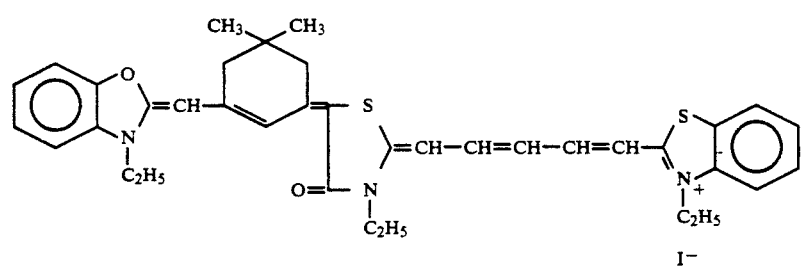 (16)
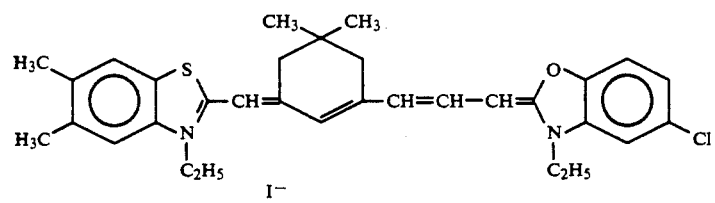 (17)
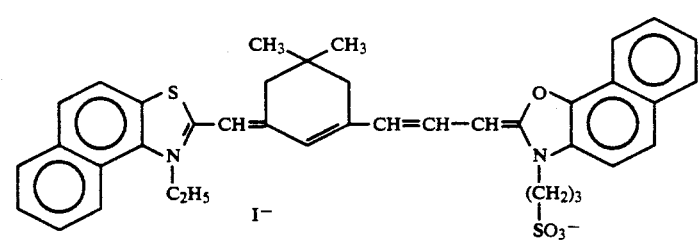 (18)
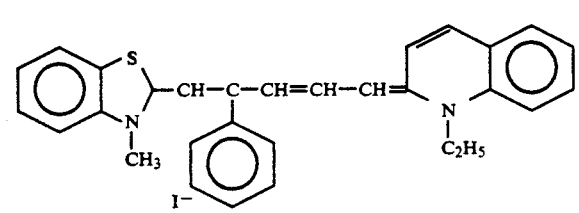 (19)

-continued
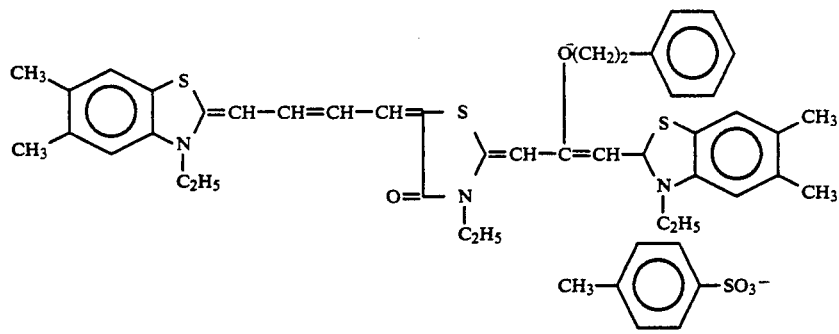
(20)
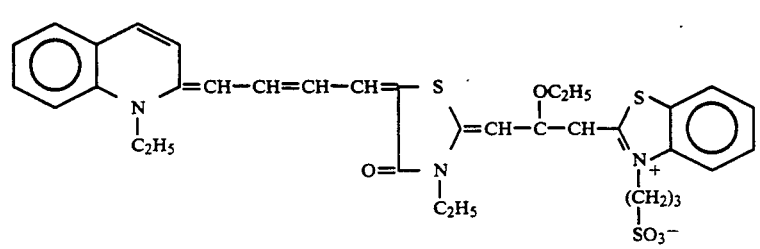
(21)
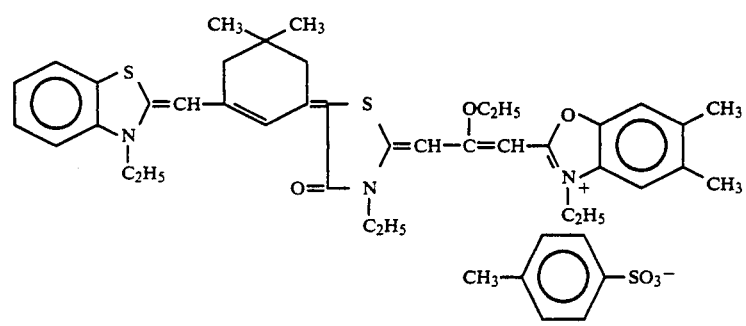
(22)
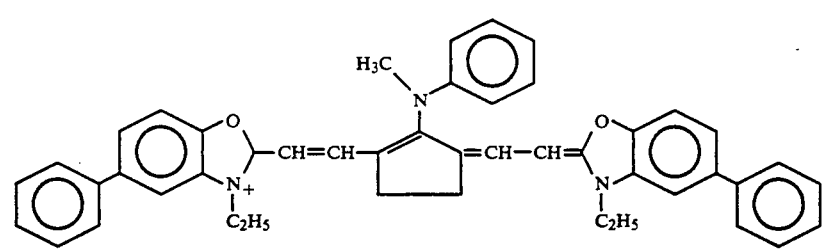
(23)
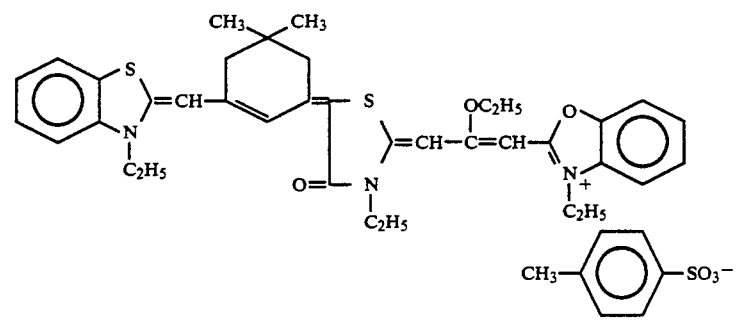
(24)

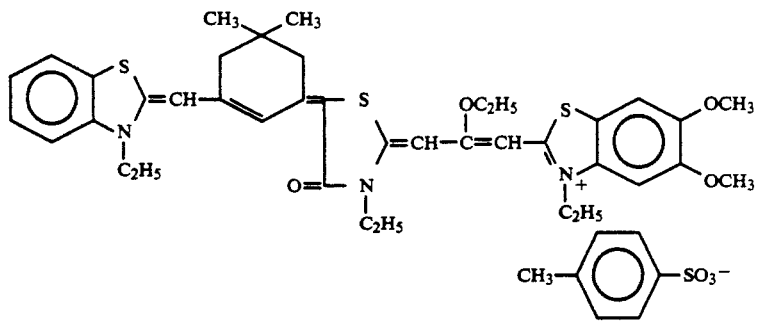
(25)
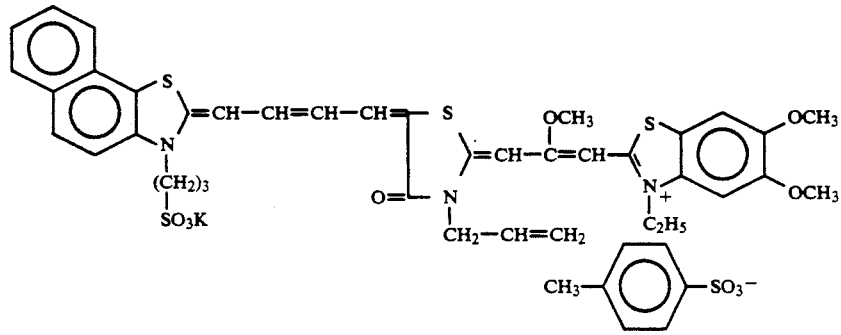
(26)
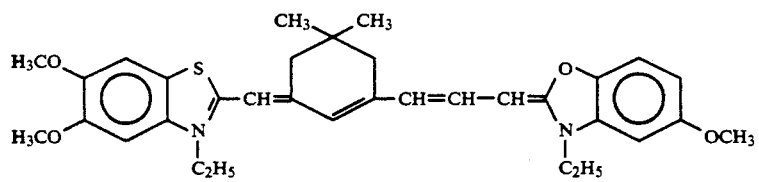
(27)
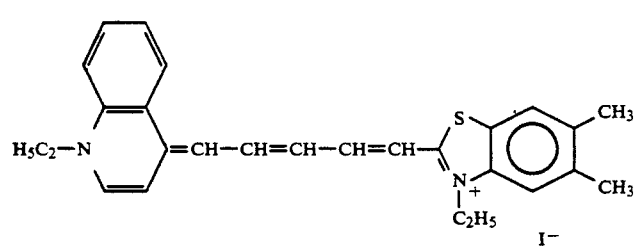
(28)
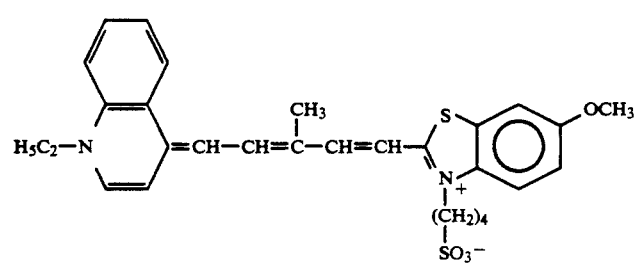
(29)
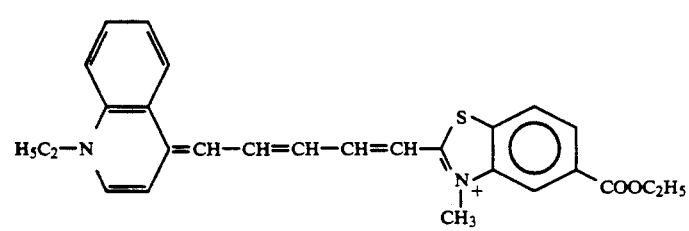
(30)

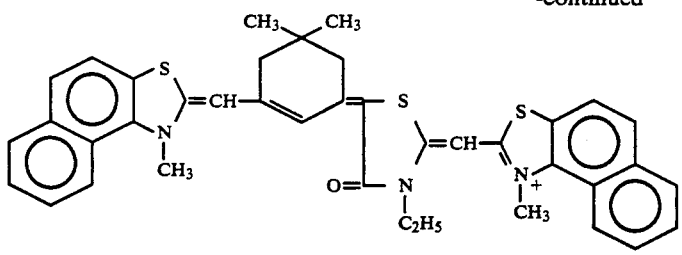

(31)

Addition amount of the sensitizing dye used in the present invention varies depending on kinds of the sensitizing dye and the silver halide photographic emulsion, but normally can be used in an amount of the wide range of 0.01–10 g per 1 kg of the silver halide in terms of silver nitrate. When the sensitizing dyes are used in combination, the total amount thereof can be within the range mentioned above and mixing ratio of the sensitizing dyes used in combination may be optional. The sensitizing dye can be added to silver halide emulsion as a solution of the dye in methanol, isopropanol, pyridine, dimethylformamide, water and the like alone or as a mixed solvent. Furthermore, the dye may be added to the emulsion by ultrasonic dispersion. Moreover, there may be employed the methods mentioned in U.S. Pat. Nos. 3,482,981, 3,585,195, 3,469,987, and 2,912,343.

The silver halide emulsion used for lithographic printing plate material of the present invention can be prepared by various methods known in the field of photosensitive materials.

The silver halide emulsion for the lithographic printing plate material of the present invention is silver chloride, silver chlorobromide containing at least 50 mol %, preferably at least 70 mol % of silver chloride and these silver halides to which a small amount (for example, 3 mol % or less) of silver iodide is added. The silver halide grains are preferably in the form of substantially cube or fourteen-faced polyhedron, though those having other crystal habits are not objectionable.

In the present invention, it is preferred to use silver halide emulsion which comprises silver halide grains mainly composed of silver chloride, namely, at least about 95 mol % of silver chloride, the silver halide grains having an average grain size of about 0.3 μ–about 1.0μ, 90% or more of total grains having a size within ±40% of the average grain size, and the surface of the grains being replaced with about 0.1 –about 3.0 mol % of an iodide per 1 mol of the silver halide. By using such emulsion, scanning type lithographic printing plate material excellent in exposure latitude can be obtained.

The mechanism of the exposure latitude being improved is not clear, but the following points can be considered as factors for the improvement. That is, when the photographic material is exposed using a scanning type exposure light source, the material receives a weak pre-exposure, a strong exposure and a weak post-exposure. It is considered that since the photographic material receives such intermittent exposure, it is preferred to use a silver halide emulsion which is not greatly affected by these auxiliary exposures. However, silver halide emulsion which is not greatly affected by the auxiliary exposures has not been technically clarified. The effect of the above-mentioned silver halide emulsion has also been clarified only after experiments.

In the present invention, the silver halide emulsion preferably comprises silver halide grains mainly composed of at least about 95 mol % of silver chloride and is preferably silver chloroiodide or silver chlorobromide emulsion, the surface of silver halide grains being replaced with about 0.1 –about 3.0 mol % of an iodide per 1 mol of silver halide. If content of the silver chloride is less than about 95 mol %, sufficient image reproducibility cannot be obtained. If content of the iodide in the surface of silver halide grains is less than about 0.1 mol % or more than about 3.0 mol %, exposure latitude deteriorates.

In the present invention, the silver halide emulsion preferably has an average grain size of about 0.3μ– about 1.0μ, 90% or more of the total grains having a size within ±40% of the average grain size. If the average grain size is less than about 0.3μ or more than about 1.0μ or grains having a grain size more than 40% of the average grain size are contained in an amount of more than 10% by weight, exposure latitude deteriorates.

The binder used in the silver halide emulsion of the present invention is usually gelatin which can be partially replaced with one or more hydrophilic polymer binders such as starch, albumin, sodium alginate, hydroxyethylcellulose, gum arabic, polyvinyl alcohol, polyvinyl pyrrolidone, carboxymethylcellulose, polyacrylamide, styrene-maleic anhydride copolymer, and polyvinylmethyl ether-maleic anhydride copolymer. It is further possible to use an aqueous dispersion (latex) of vinyl polymers.

The silver halide emulsion can be sensitized in various ways during its preparation or coating. The emulsion is preferably sensitized chemically by the methods well known to the art by using, for example, sodium thiosulfate, alkylthioureas or gold compounds such as gold rhodanide and gold chloride or mixtures thereof. Furthermore, those characteristics such as high sensitivity, high sharpness and high resolving power which are desirable for the direct plate making may be imparted by adding, at any time during the emulsion preparation, compounds of metals of Group VIII of the periodic table, such as, for example, salts of cobalt, nickel, rhodium, palladium, iridium, and platinum. The addition amount is in the range of $10^{-8}$–$10^{-3}$ mol for 1 mol of silver halide. The silver halide emulsion layer may contain other additives such as coating aids, antifoggants, matting agents (water-holding agents), and developing agents which are customarily used.

An undercoating layer for improving adhesion and/or for antihalation which may contain a developer or a matting agent may be provided below the silver halide emulsion layer (and above the support).

The lithographic printing plate material of the present invention has an image receiving layer which contains physical development nuclei.

As the physical development nuclei, there may be used known ones such as metals such as antimony, bismuth, cadmium, cobalt, palladium, nickel, silver, lead, and zinc and sulfides thereof. The image receiving layer may not contain hydrophilic colloid or may contain hydrophilic colloids such as gelatin, carboxy-methylcellulose, gum arabic, sodium alginate, hydroxy-ethyl starch, dextrin, hydroxyethylcellulose, poly-styrenesulfonic acid, a copolymer of vinylimidazole and acrylamide and polyvinyl alcohol in an amount of preferably 0.1 g or less per 1 m$^2$.

The image receiving layer may further contain hygroscopic substances or wetting agents such as sorbitol and glycerol. The receiving layer may further contain antiscumming pigments such as barium sulfate, titanium dioxide, China clay, and silver, developing agents such as hydroquinone and hardeners such as formaldehyde.

The supports may be films such as cellulose acetate film, polyvinyl acetal film, polystyrene film, polypropylene film, polyethylene terephtharate film and composite films such as polyester, polypropylene, or polystyrene films coated with polyethylene film. These supports may preferably have a subbing layer for improving adhesion and furthermore, may contain an antihalation dye or pigment.

The DTR solution used in the present invention may contain alkaline substances such as sodium hydroxide, potassium hydroxide, lithium hydroxide and sodium tertiary phosphate; preservatives such as sulfites; silver halide solvents such as thiosulfates, thiocyanates, cyclic imides, thiosalicylic acid, and amines; thickening agents such as hydroxyethylcellulose and carboxymethylcellulose; antifoggants such as potassium bromide, 1-phenyl-5-mercaptotetrazole, compounds described in Japanese Patent Kokai No.47-26201; developing agents such as hydroquinone and 1-phenyl-3-pyrazolidone; and development modifiers such as polyoxyalkylene compounds and onium compounds.

In carrying out the silver complex diffusion transfer process, the developing agent may be contained in the silver halide emulsion layer and/or the image receiving layer or other water permeable layers contiguous thereto as described in British Patent Nos. 1,000,115, 1,012,476, 1,017,273 and 1,042,477. Therefore, in such case, use may be made of so-called "alkaline activating solution" containing no developing agent.

The lithographic printing plate made in accordance with the present invention can be rendered ink receptive or enhanced in ink receptivity by use of such compounds as described in Japanese Patent Kokoku No. 48-29723 and U.S. Pat. No. 3,721,539.

Printing method, etch solution and dampening solution are those which are known to the art.

The following nonlimiting examples further illustrate the present invention.

EXAMPLE 1

On one side of a polyethylene terephthalate film, was coated a matting layer containing powdered silica of 5 μm in average particle size. On another side, was coated an undercoat layer (adjusted to pH 4.1) containing carbon black and phenidone and powdered silica of 7 μm in average particle size in an amount of 16% by weight based on the weight of photographic gelatin. On this undercoat layer, was coated a silver halide emulsion layer containing powdered silica of 7 μm in average particle size in an amount of 5% by weight of photographic gelatin. Various samples different in water content were prepared by changing temperature, dew point and flow rate of air used for drying after coating.

In this Example, the silver halide emulsion was prepared by firstly usual physical ripening. At the time of physical ripening, iridium was added in an amount of $5 \times 10^{-6}$ mol per 1 mol of the silver halide and the silver halide grains comprised substantially cubic silver chloride crystal having an average grain size of 0.33 μm and 90% or more of the total grains were distributed within ±30% of the average grain size. then, the emulsion was chemically sensitized with a gold compound and hypo and subsequently, spectrally sensitized by adding red sensitizing dye (I) in an amount of 1.82 mg/g AgNO$_3$ or infrared sensitizing dye (13) in an amount of 0.28 mg/g AgNO$_3$.

The application rate of gelatin in the undercoat layer was 3.6 g/m$^2$, that of gelatin in the emulsion layer was 1.2 g/m$^2$ and that of silver halide in terms of silver nitrate was 1.5 g/m$^2$. These undercoat layer and the emulsion layer contained 28 mg of formal-dehyde as a hardener for 1 g of gelatin.

After coating and drying, on the emulsion layer was coated the nuclei coating composition used for Plate No.11 in Example 1 of Japanese Patent Kokai No.54-103104 which contained 0.8 g/m$^2$ of hydroquinone.

Water content of each sample was measured by over drying method.

For sensitometry, each sample was exposed through an wedge of 0.15 in density difference for 10$^{-6}$ second using an interference filter of 633 nm or 780 nm.

Separately, for printing test the samples were subjected to formation of dot images and fine line images thereon by exposure using a helium.neon laser type setter Linotronic 300 (manufactured by Linotype Co.) or a semiconductor laser setter Ultre Setter (manufactured by Ultre Co.).

For evaluation of storage stability of the lithographic printing plate of the present invention, the samples were force-heated at 50° C. for 4 days. Samples for sensitometry and printing test were obtained in the same ways as above.

Each of the exposed printing plate materials was developed with the following diffusion transfer developer at 25° C. for 30 seconds. After development, the material was passed between two squeezing rollers to remove excess developer and immediately was treated with the following neutralizing solution at 25° C. for 20 seconds and was dried at room temperature after removal of excess solution by squeezing rollers.

| Diffusion transfer developer: | |
|---|---|
| Water | 700 ml |
| Sodium hydroxide | 18 g |
| Potassium hydroxide | 7 g |
| Anhydrous sodium sulfite | 50 g |
| 2-Mercaptobenzoic acid | 1 g |
| Uracil | 10 g |
| 2-Methylaminoethanol | 30 ml |
| 5-Phenyl-2-mercapto-1,3,4-oxadiazole | 0.1 g |
| Potassium bromide | 1 g |
| Water to make up 1 liter. | |
| Neutralizing solution: | |
| Water | 600 ml |
| Citric acid | 10 g |
| Sodium citrate | 35 g |
| Colloidal silica (20% solution) | 5 ml |
| Ethylene glycol | 5 ml |

-continued

| | |
|---|---|
| Water to make up 1 liter. | |

Each of the samples for printing test (printing plates) was applied to a sheet and this sheet was mounted on an offset printing machine. The following etch solution was applied to allover the plate surface and printing was carried out using the following dampening solution. The printing machine was A. B. Dick 350 CD (Trademark for offset printing machine manufactured by A. B. Dick Co.).

| Etch solution: | |
|---|---|
| Water | 600 ml |
| Isopropyl alcohol | 400 ml |
| Ethylene glycol | 50 g |
| 3-Mercapto-4-acetamide-5-n-heptyl-1,2,4-triazole | 1 g |
| Dampening solution: | |
| o-Phosphoric acid | 10 g |
| Nickel nitrate | 5 g |
| Sodium nitrite | 5 g |
| Ethylene glycol | 100 g |
| Colloidal silica (20% solution) | 28 g |
| Water to make up 2 liters | |

The printing endurance was evaluated in terms of the number of copies delivered before the printing had become impossible owing to the occurrence of scumming or partial disappearance of silver image and expressed in grade number rated in accordance with the following criteria.

| Grade number | Number of copies |
|---|---|
| 1 | <4,000 |
| 2 | 4,000–6,000 |
| 3 | 6,000–8,000 |
| 4 | 8,000–10,000 |
| 5 | >10,000 |

Sensitivity of the lithographic printing plate material was expressed as a relative value by assuming the sensitivity of Sample Nos. 1 and 13 to be 100.

Water content, relative sensitivity, gamma, and printing endurance of the samples (red sensitive materials) are shown in Table 1 on fresh samples (unheated) and force-heated samples and those of the samples (infrared sensitive materials) are shown in Table 2.

As can be seen from Tables 1 and 2, lithographic printing plate materials of high sensitivity, high contrast and high printing endurance and excellent storage stability can be produced according to the present invention.

TABLE 1

| Sample No. | Water content (%) | Fresh sample | | | Sample heated at 50° C. for 4 days | | |
|---|---|---|---|---|---|---|---|
| | | Sensitivity | Gamma | Printing endurance | Sensitivity | Gamma | Printing endurance |
| 1. (The present invention) | 1.0 | 100 | 2.1 | 5 | 96 | 1.9 | 4 |
| 2. | 1.6 | 70 | 1.6 | 4 | 40 | 1.2 | 2 |
| 3. | 1.7 | 65 | 1.4 | 4 | 40 | 1.2 | 2 |
| 4. (The present invention) | 1.4 | 95 | 2.0 | 4 | 90 | 1.8 | 4 |
| 5. | 1.8 | 60 | 1.4 | 4 | 40 | 1.2 | 2 |
| 6. (The present invention) | 0.9 | 100 | 2.1 | 5 | 98 | 2.0 | 5 |
| 7. | 2.0 | 50 | 1.2 | 4 | 30 | 1.0 | 2 |
| 8. | 2.4 | 40 | 0.8 | 3 | 20 | 0.6 | 1 |
| 9. (The present invention) | 0.7 | 105 | 2.2 | 5 | 95 | 2.0 | 5 |
| 10. (The present invention) | 1.2 | 102 | 2.0 | 5 | 92 | 1.9 | 4 |
| 11. | 2.1 | 50 | 1.2 | 4 | 28 | 0.9 | 2 |
| 12. | 2.2 | 45 | 1.1 | 4 | 30 | 0.7 | 2 |

TABLE 2

| Sample No. | Water content (%) | Fresh sample | | | Sample heated at 50° C. for 4 days | | |
|---|---|---|---|---|---|---|---|
| | | Sensitivity | Gamma | Printing endurance | Sensitivity | Gamma | Printing endurance |
| 13. (The present invention) | 1.0 | 100 | 2.6 | 5 | 98 | 2.5 | 5 |
| 14. | 1.6 | 70 | 1.8 | 4 | 50 | 1.3 | 2 |
| 15. | 1.7 | 65 | 1.7 | 4 | 45 | 1.2 | 2 |
| 16. (The present invention) | 1.4 | 95 | 2.5 | 4 | 90 | 2.3 | 4 |
| 17. | 1.8 | 65 | 1.6 | 4 | 40 | 1.0 | 2 |
| 18. (The present invention) | 0.9 | 105 | 2.6 | 5 | 100 | 2.5 | 5 |
| 19. | 2.0 | 50 | 1.4 | 4 | 30 | 1.0 | 2 |
| 20. | 2.4 | 40 | 1.2 | 3 | 20 | 0.8 | 1 |
| 21. (The present invention) | 0.7 | 110 | 2.7 | 5 | 105 | 2.7 | 5 |
| 22. (The present invention) | 1.2 | 100 | 2.5 | 5 | 95 | 2.3 | 4 |

EXAMPLE 2

On one side of a polyethylene terephthalate film, was provided a matting layer containing powdered silica of 5μ in average particle size. On another side, was provided an undercoat layer (adjusted to pH 4.1) containing carbon black and phenidone and powdered silica of 7 μm in average particle size in an amount of 16% by weight based on the weight of photographic gelatin. On this undercoat layer, was provided a silver halide emulsion layer (adjusted to pH 4.5) containing 2-mercaptobenzoic acid and powdered silica of 7 μm in average particle size in an amount of 5% by weight of photographic gelatin after chemically sensitized with a gold compound and hypo. To the silver halide emulsion was added 1.82 mg/g AgNO₃ of sensitizing dye (6) in the form of a solution. At the time of physical ripening, iridium was added in an amount of $5 \times 10^{-6}$ mol per 1 mol of the silver halide and at the time of completion of the physical ripening, a KI solution in an amount of 1 mol % per 1 mol of silver halide was added to substantially cubic silver chloride crystal having an average grain size of $0.33\mu$ and 90% or more of the total grains were distributed within ±30% of the average grain size, thereby to replace the surface of the silver halide grains with iodide. The resulting silver halide emulsion was used in this example.

The application rate of gelatin in the undercoat layer was 3.6 g/m², that of gelatin in the emulsion layer was 1.2 g/m² and that of silver halide in terms of silver nitrate was 1.5 g/m². These undercoat layer and the emulsion layer contained 28 mg of formal-dehyde as a hardener for 1 g of gelatin The resulting sample was dried under the same drying conditions as for Sample No. 1 in Example 1 and water content was measured to obtain 1.0%.

After coating and drying, on the emulsion layer heated at 40° C. for 7 days was coated a physical development nuclei coating composition prepared in the following manner according to the process for preparation of the nuclei coating solution used for Plate No. 11 in Example 1 of Japanese Patent Kokai No. 54-103104.

| Solution A: | |
| --- | --- |
| Palladium chloride | 5 g |
| Hydrochoric acid | 40 ml |
| Water | 1,000 ml |
| Solution B: | |
| Sodium sulfide | 86 g |
| Water | 1,000 ml |

Solution A and solution B were mixed with stirring and after elapse of 30 minutes, the mixture was passed through a column packed with an ion exchange resin (IR-120B, IRA-400) made for preparation of pure water and then thereto was added the following solution C containing the polyfunctional polymer No. 2 described in Example 1 of Japanese Patent Kokai No. 54-103104, sodium polyacrylate (average molecular weight 500,000) and a surface active agent and then was added the following solution D to obtain a physical development nuclei solution.

| Solution C: | |
| --- | --- |
| Polyfunctional polymer | 5 g |
| Sodium polyacrylate (average molecular weight 500,000) | 50 g |
| Water | 15,200 ml |
| 10% Saponin | 20 ml |
| Solution D: | |
| Hydroquinone | 1,200 g |
| Dimethylformamide | 1,600 ml |

-continued

| Water | 1,200 ml |
| --- | --- |

The coating solution was coated at a rate of 8 m/min by dipping method to make a plate. (Sample No. 23).

Furthermore, a plate was made in the same manner as above except that average grain size of silver halide grains was $0.27\mu$ and addition amount of the sensitizing dye (6) was 2.06 mg/g AgNO₃ to make the sensitivity same as that of Sample No. 23 (Sample No. 24).

On these samples were formed dot images and fine images by exposure using helium.neon laser type setter Linotronic 300 (manufactured by Linotype Co.) in the same manner as in Example 1 and furthermore, the samples were exposed to fine line image of $50\mu$ in width with changing exposure intensity.

Thereafter, treatment and evaluation were conducted in the same manner as in Example 1.

Sensitivity was expressed as a relative value by assuming the sensitivity of Sample No. 23 to be 100. Other evaluations were conducted in the same manner as in Example 1.

TABLE 3

| Sample No. | Water content (%) | Fresh sample | | | Sample heated at 50° C. for 4 days | | |
| --- | --- | --- | --- | --- | --- | --- | --- |
| | | Sensitivity | Gamma | Printing endurance | Sensitivity | Gamma | Printing endurance |
| 23 | 1.0 | 100 | 2.2 | 5 | 98 | 2.0 | 5 |
| 24 | 1.0 | 100 | 1.9 | 5 | 95 | 1.7 | 4 |

As can be seen from Table 3, Sample Nos. 23 and 24 were both high in sensitivity, contrast and printing endurance and excellent in storage stability.

The results obtained on fine lines of $50\mu$ in width are shown in Table 4.

TABLE 4

| Exposing dial of Linotronic 300 | Image formed on the plate | | Image after printing | |
| --- | --- | --- | --- | --- |
| | Sample 23 | Sample 24 | Sample 23 | Sample 24 |
| 160 | 62μ | 65μ | 60μ | 63μ |
| 170 | 57 | 60 | 55 | 58 |
| 180 | 55 | 58 | 53 | 55 |
| 190 | 51 | 55 | 50 | 53 |
| 230 | 51 | 50 | 49 | 48 |
| 240 | 47 | 46 | 46 | 44 |
| 250 | 47 | 44 | 45 | 42 |
| 260 | 44 | 40 | 42 | 39 |
| 270 | 43 | 37 | 41 | 35 |

Next, from Table 4 the exposing dial was read at which the samples reproduced fine line images of $45\mu$ and $55\mu$ in width and when quantities of exposure corresponding to the exposing dials were referred to as $E_{45}$ and $E_{55}$ and difference in their logarithmic values log $E_{45}$ and log $E_{55}$ was referred to as exposure latitude L rel, L rel of the samples was as shown in Table 5.

TABLE 5

| Sample No. | Average grain size | L rel after plate making | L rel after printing |
| --- | --- | --- | --- |
| 23 | 0.33 | 0.24 | 0.23 |
| 24 | 0.27 | 0.16 | 0.15 |

As is clear from Table 5, Sample No. 23 was greater than Sample No. 24 in exposure latitude and thus the effect on the exposure latitude was clear.

EXAMPLE 3

This Example shows the effect of iodide replaced on the surface of grains.

Sample Nos. 26, 27, and 28 and Comparative Sample Nos. 25 and 29 were prepared in the same manner as in Example 2 except that the KI solution was added in the amounts as shown in table 6 at the time of completion of physical ripening and similarly, fine line images were formed and the exposure latitude was calculated.

As is clear from Table 6, Sample Nos. 26, 27 and 28 were superior in exposure latitude to Sample No. 25 with addition of no KI and Sample No. 29 with addition of a large amount of KI.

TABLE 6

| Sample No. | Addition amount of KI (mol/molAgX) | Image formed on the plate | Image after printing |
| --- | --- | --- | --- |
| 25 | 0 | 0.16 | 0.14 |
| 26 | 0.2 | 0.22 | 0.22 |
|  |  | 0.24 | 0.23 |
| 27 | 1.0 | 0.24 | 0.23 |
| 28 | 2.0 | 0.17 | 0.17 |
| 29 | 4.0 |  |  |

What is claimed is:

1. A lithographic printing plate material for silver complex diffusion transfer process by scanning type exposure which comprises a film support and, provided thereon, at least a silver halide emulsion layer and a surface physical development nuclei layer, wherein water content in the whole lithographic printing plate material including the support is 1.5% by weight or less.

2. A lithographic printing plate material according to claim 1, wherein the silver halide emulsion comprises about 95 mol % or more of silver chloride, 90% by weight or more of the silver halide grains have a size within ±40% of average grain size, the silver halide grains have an average grain size of about 0.3μ–about 1.0μ and the surface of the grains is replaced with about 0.1–3.0 mol of an iodide per 100 mol of the silver halide.

3. A method for making a lithographic printing plate which comprises imagewise exposing the lithographic printing plate of claim 1 or 2 to a scanning type exposure light source and diffusion transfer developing the exposed material in the presence of a silver halide solvent to form a silver image on the physical development nuclei layer.